United States Patent [19]

Derryberry

[11] Patent Number: 4,907,067
[45] Date of Patent: Mar. 6, 1990

[54] THERMALLY EFFICIENT POWER DEVICE PACKAGE

[75] Inventor: Lesli A. Derryberry, Dallas, Tex.

[73] Assignee: Texas Instruments Incorporated, Dallas, Tex.

[21] Appl. No.: 192,802

[22] Filed: May 11, 1988

[51] Int. Cl.⁴ ...................... H01L 23/02; H01L 39/02
[52] U.S. Cl. ......................................... 357/74; 357/80
[58] Field of Search .............................. 357/74, 80, 81

[56] References Cited

U.S. PATENT DOCUMENTS

| 3,025,437 | 3/1962 | Namen et al. | 357/81 |
| 4,698,662 | 10/1987 | Young et al. | 357/81 |
| 4,703,339 | 10/1987 | Matsuo | 357/81 |

FOREIGN PATENT DOCUMENTS

| 3125360 | 1/1983 | Fed. Rep. of Germany | 357/74 |
| 0107063 | 7/1982 | Japan | 357/81 |
| 0180130 | 9/1985 | Japan | 357/81 |
| 0133555 | 6/1988 | Japan | 357/81 |
| WO79/00302 | 5/1979 | PCT Int'l Appl. | 357/74 C |

Primary Examiner—Frank Gonzalez
Attorney, Agent, or Firm—B. Peter Barndt; James T. Comfort; Melvin Sharp

[57] ABSTRACT

A hermetic semiconductor device package is disclosed which is capable of handling high power devices in an electrically and thermally efficient manner. The package includes a dielectric substrate with cutouts for die mount and/or bonding to a plurality of thermally and electrically conductive plates which are electrically isolated from each other.

12 Claims, 2 Drawing Sheets

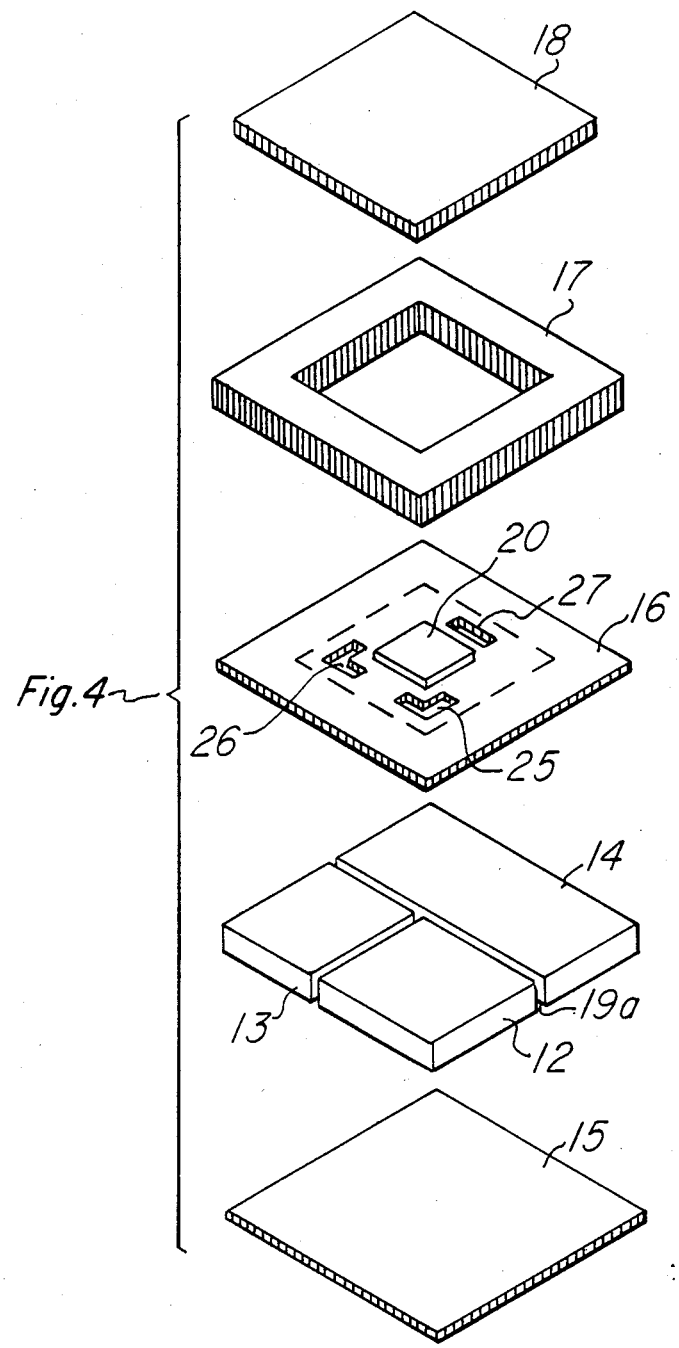

THERMALLY EFFICIENT POWER DEVICE PACKAGE

FIELD OF THE INVENTION

This invention relates to semiconductor devices, and more particularly to a thermally efficient package for a power semiconductor device.

BACKGROUND OF THE INVENTION

Packages for power transistors need to be thermally efficient and provide means for transferring heat produced by the transistor away from the transistor to keep it environmentally within its normal temperature operating range. Packages for power devices have consisted of metal bases where the backside of the device is mounted directly to the metal base which forms one contact to the semiconductor device. Other packages have a layer of insulating material or insulative adhesive between the device chip and the mounting base which may serve also as a heat sink to transfer heated generated by the device away from the device. Such packages may provide thermal transfer characteristics required by the device, but may not provide the capability of carrying high currents. In high density circuits of the present technology, it is necessary to have a device package for power semiconductor devices that can handle high currents and be thermally and electrically efficient.

BRIEF SUMMARY OF THE INVENTION

The invention is a thermally efficient power semiconductor package. The package is basically a dielectric substrate mounted upon a plurality of thermally and electrically conductive plates, electrically isolated from each other and physically arranged to provide for the current carrying capacity and the thermal dissipation required for a particular device configuration.

The dielectric substrate is a continuous piece of material, for example, alumina, beryllia or other ceramic, which has cutouts provided for the device and/or for providing access to the conductive plates mounted below the substrate. The plates are bonded to the substrate to ensure that the assembly is, when enclosed, hermetically sealed.

An optional window frame/seal ring may be mounted on the top side of the main dielectric substrate to facilitate sealing. The window frame may be metal or ceramic with or without internal embedded circuitry. Alternately, a metal or ceramic lid may be used.

The thermally and electrically conductive plates mounted on the underside of the main dielectric substrate have a high current carrying capacity and are thermally efficient. The gaps or separation between the plates are filled with a dielectric material to ensure electrical isolation. Materials such as epoxy, RTV and glass are examples of materials that may be used.

The package is adaptable to several mounting methods. A dielectric mask can be screen printed on the back of the plates to expose a prescribed metalized mounting pattern which would allow the package to be surface mounted, or soldered directly to a printed circuit board. The plates may be designed with lateral extensions which may be used to fasten the package to a printed circuit board. Electrical connection to the package may be the lateral extensions or by other wires/connection mounted on or extending from the package.

An optional, thicker, structural layer of a dielectric may mounted to the underside of the metal plates to ensure electrical isolation from a printed circuit board on which the package is to be mounted. This dielectric layer may be metalized in a prescribed pattern and brazed to the underside of the metal plates to provide a conventional type of surface mount configuration similar to a standard leadless ceramic chip carrier.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 4 is an exploded pictorial representation of the invention.

DESCRIPTION OF A PREFERRED EMBODIMENT

Figure 1:
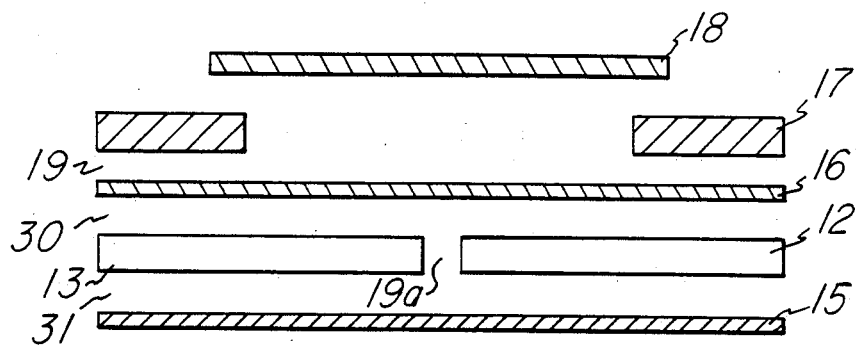
FIG. 1 is an exploded side view of the package of the present invention.

FIG. 1 is an exploded view of the package of the invention. The package 10 consists basically of a dielectric substrate 16 mounted upon several thermally and electrically conductive plates. In FIG. 1, two plates 12 and 13 are shown, but for a normal power semiconductor at least three plates are needed as shown in FIG. 4. Plates 12, 13 and 14, are electrically conductive and are electrically insulated from each other. The dielectric substrate 16 may be, for example, a continuous piece of material such as alumina, beryllia or some other ceramic material.

A window frame/seal ring 17 of alumina or BeO is mounted on the dielectric substrate 16 to enclose a semiconductor device mounted on the substrate 16, and the opening formed by seal ring 17 is closed by lid 18, which may be either ceramic or metal.

A bottom plate 15 may be used to provide isolation or extra strength to the package, and provide a mounting base for the three conductive plates 12, 13 and 14.

The seal ring 17, substrate 16, conductive plates 12, 13 and 14, and the base 15 may be brazed together. The opening 19a between the conductive plates 12, 13 and 14 is filled with a nonconductive material, for example epoxy, RTV or dielectric glass.

Figure 2:
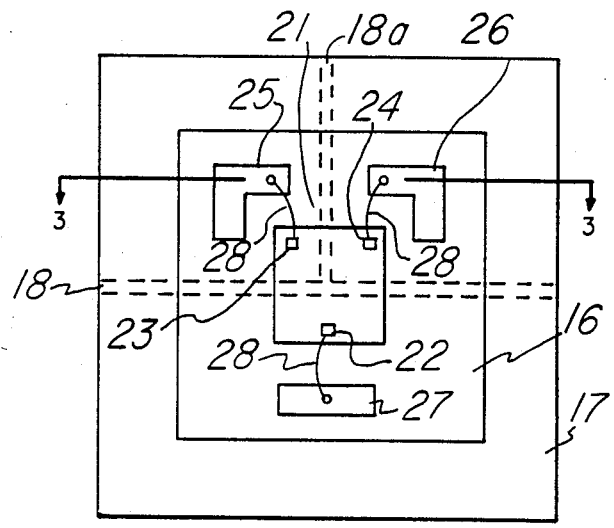
FIG. 2 is a top view of the package of the invention.

FIG. 2 is an assembled top view of the package with a semiconductor device mounted in the package. Substrate 16 has the seal ring 17 mounted thereon. Also mounted on the substrate is a semiconductor device 21. Semiconductor device 21 has three contact pads 22, 23 and 24 thereon for making contact to the semiconductor device. The contact pads are connected to a respective one of the conductive plates 12, 13, and 14, by connecting wires 28. Connection is made to the conductive plates through openings 25, 26 and 27 in the substrate 16.

The multiple metal plates 12, 13, and 14 mounted on the under side of dielectric substrate 16 have high current carrying capacity and are thermally efficient to carry heat away from the semiconductor device 21.

Figure 3:
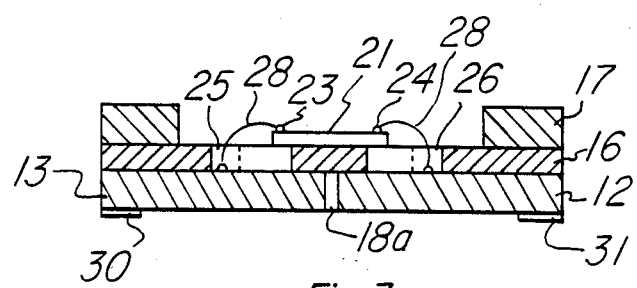
FIG. 3 is a section view taken through FIG. 2.

FIG. 3 is a cross sectional view taken along line 3-3 of FIG. 2. FIG. 3 illustrates interconnection of connecting wires 28 between semiconductor pads 23 and 24 to plates 12 and 13. As shown in FIG. 3, the connecting wires 28 pass through openings 25 and 26.

FIG. 1 shows a base 15 under the plates 12 and 13. FIG. 3 does not show base 15, but has mounting pads 30 and 31 (a third pad on the third plate is not illustrated). Pad 30 and 31 are for surface mounting the device package. A dielectric mask may be screened on the back of the plates with only the areas for the mounting the pads exposed. This allows the package to be surface mounted or soldered directly to a printed circuit board.

FIG. 4 is an exploded view of a complete package according to the present invention. There are three conductive metal base plates 12, 13, and 14. These plates may have extensions (not illustrated) for screw mounting to a circuit board or have mounting pads as illustrated in FIG. 3.

A dielectric substrate 16 mounts directly on and is bonded to the metal base plates 12, 13, and 14. Substrate 16 has three cut outs 25, 26 and 27 through which contact is made from the semiconductor device 20 to the three metal plates.

An enclosing seal ring 17 is bonded to substrate 16 and encloses the side of the semiconductor mount area. The semiconductor device is enclose by lid 18 which is metal or ceramic and is soldered or welded to seal ring 17.

An optional dielectric layer 15 may be used to isolate the metal plates from a circuit board on which it may be mounted.

Although a specific embodiment has been described, variations may be made such as having a round package with wedge shaped metal base plate. Also, circuit patterns may be screened onto the substrate to accommodate multilead devices or a plurality of devices within the same package. Connecting leads may extend out the sides of the packages for connection to the device or devices within the package.

What is claimed:

1. A high current, thermally efficient semiconductor device package, comprising; a plurality of metal base plates, and electrically insulating substrate mounted on and bonded to said metal base plates, and an enclosure for mounting on said electrically insulating substrate and enclosing such semiconductor device that is mounted on said electrically insulating substrate, the metal base plates being adapted for electrical interconnection to the semiconductor device that is mounted on the electrically insulating substrate.

2. The device package according to claim 1, wherein said metal base plates have opposed sides and wherein said electrically insulating substrate is mounted on and bonded to one of said sides of said metal base plates, further comprising:
   a dielectric layer bonded to the other one of said sides of said metal base plates to isolate the metal plates from a mounting surface.

3. The package according to claim 1, wherein said electrically insulating substrate has a plurality of openings therein to allow interconnecting between a semiconductor device mounted on said electrically insulating substrate and said metal base plates.

4. The package according to claim 1, further comprising:
   electrically conductive connection pads on one side of said metal plates to permit surface mounting of the package to a printed circuit board.

5. The package according to claim 1, further comprising:
   lateral extensions on each of said metal plates to permit screw mounting of said package to a circuit board.

6. The package according to claim 1, wherein said metal plates are electrically isolated from each other by a sealing material.

7. A package for a thermally efficient power semiconductor device, comprising; a dielectric substrate for mounting a semiconductor device, a plurality of thermally and electrically conductive plates electrically isolated from each other and physically arranged to provide connection to a semiconductor device, and to provide current carrying capacity and thermal dissipation for a semiconductor device, said conductive plates having opposed sides, said dielectric substrate mounted on and bonded to one of said sides of said conductive plates, an enclosure for hermetically enclosing a semiconductor device mounted on said dielectric substrate, and connection terminals for electrically contacting said conductive plates for providing external connections to a semiconductor device mounted on said dielectric substrate and hermetically sealed within said package.

8. The device package according to claim 7, including a dielectric layer bonded to the other one of said sides of said conductive plates to isolate said plates from a mounting surface.

9. The package according to claim 7, wherein said dielectric substrate has a plurality of openings therein to allow interconnection between a semiconductor device mounted on said dielectric substrate and said conductive plates.

10. The package according to claim 7, including electrically conductive connection pads on one side of said conductive plates to permit surface mounting of the package to a circuit board.

11. The package according to claim 7, including lateral extensions on each of said conductive plates to permit screw mounting of said package to a circuit board.

12. The package according to claim 7, wherein said conductive plates are electrically isolated from each other by a sealing material.

* * * * *